United States Patent
Ng et al.

[11] Patent Number: 5,946,589
[45] Date of Patent: Aug. 31, 1999

[54] ELIMINATION OF VOID FORMATION IN ALUMINUM BASED INTERCONNECT STRUCTURES

[75] Inventors: Yat Meng Ng; Xin Zhang, both of Singapore, Singapore

[73] Assignee: Chartered Semiconductor Manufacturing, Ltd., Singapore, Singapore

[21] Appl. No.: 08/947,884

[22] Filed: Oct. 9, 1997

[51] Int. Cl.[6] .................................................. H01L 21/441
[52] U.S. Cl. ........................ 438/586; 438/595; 438/688
[58] Field of Search .................................... 438/586, 595, 438/637, 675, 688

[56] References Cited

U.S. PATENT DOCUMENTS

| | | | |
|---|---|---|---|
| 5,221,424 | 6/1993 | Rhoades | 156/664 |
| 5,397,432 | 3/1995 | Konno et al. | 156/665 |
| 5,472,890 | 12/1995 | Oda | 438/595 |
| 5,473,184 | 12/1995 | Murai | 438/595 |
| 5,545,289 | 8/1996 | Chen et al. | 156/643.1 |
| 5,545,574 | 8/1996 | Chen et al. | 438/586 |
| 5,750,439 | 5/1998 | Naito | 438/688 |

*Primary Examiner*—Chandra Chaudhari
*Attorney, Agent, or Firm*—George O. Saile; Stephen B. Ackerman

[57] ABSTRACT

A process for forming aluminum based interconnect structures, with a reduced risk of void formation, occurring during photoresist removal and clean up procedures, has been developed. The process features removing the photoresist layer, used as a mask for patterning of an aluminum based layer, using a two phase, in situ photoresist removal procedure, followed by a cold water rinse. An aluminum oxide layer, formed during the initial phase of the two phase, in situ photoresist removal procedure, protects the sides of the aluminum based interconnect structure, during post-clean procedures, reducing the risk of galvanic corrosion and void formation. In addition the temperature of a DI water, post-clean procedure, has also been decreased to between about 5 to 10° C., reduced, also reducing the risk of galvanic corrosion, that can occur during the post clean procedures.

11 Claims, 3 Drawing Sheets

ELIMINATION OF VOID FORMATION IN ALUMINUM BASED INTERCONNECT STRUCTURES

BACKGROUND OF THE INVENTION

1. Field of the Invention

The present invention relates to method used to fabricate semiconductor devices, and more specifically to a method used to eliminate the formation of voids, in aluminum based interconnect structures, created during photoresist removal procedures.

2. Description of the Prior Art

Aluminum, or aluminum based metallizations, have been extensively used by the semiconductor industry, for wiring or interconnect structures. The ability to easily deposit aluminum, using either sputtered or evaporation procedures, as well as the ability to easily pattern aluminum layers, using high density plasma etching, (HDPE), procedures, have resulted in the recurrent use of this metal in advanced semiconductor type products, such as metal oxide semiconductor field effect transistors, (MOSFET). However the inability of aluminum to withstand high current densities required the addition of small levels of copper, usually between about 1 to 5%, to be included in the aluminum layers. The Al—Cu alloy resulted in dramatic improvement in electromigration resistance, when compared to pure aluminum counterparts. In addition to copper in aluminum layers, small levels of silicon, between about 0.5 to 1.0% are also added to the alloy, to reduce the risk of aluminum penetration, into the semiconductor substrate, that can occur during elevated temperature cycles.

The addition of copper, to aluminum layers, although resulting in electromigration resistance improvements, increased the risk of specific type of corrosion mechanisms, of the Al—Cu alloy, compared to the risk of corrosion encountered with pure aluminum layers. For example during the deposition of Al—Cu alloy, a theta phase of $Al_2Cu$ precipitates are formed, highly rich in copper, and surrounded by regions of aluminum, that have almost been completely depleted of copper. This inhomogeneity, in the aluminum based layer, can result in a galvanic cell in which the $Al_2Cu$ precipitates behave as the cathode, while the surrounding aluminum rich regions behave as the anode. Therefore the presence of an electrolyte can then result in galvanic corrosion, or a redox reaction, in which Al will be oxidized, while the Cu is reduced. The $Al^{3+}$ ions produced during this reaction, can be leached away during subsequent water rinses. Since this galvanic reaction is localized near the $Al_2Cu$ precipitates, the result of this galvanic reaction is the formation of voids in the aluminum layer. The aluminum based layer, containing voids, is now less resistant to deleterious electromigration phenomena, as well as exhibiting a decrease in conductivity.

The electrolyte needed to initiate the galvanic reaction, can be water, used for post-clean rinsing procedures. For example patterning of an aluminum based layer, comprised of $Al_2Cu$ precipitates, as well as aluminum rich regions, is usually performed using HDPE procedures, and using a photoresist shape as a mask. After completion of the patterning procedure the photoresist shape is removed via a strip process; first an $H_2O$ vapor passivation strip, and than an $O_2$ plasma ashing step. These procedures are followed by a water rinse, performed at a temperature between about 20 to 25° C. The exposed sides of the aluminum based structure, with the exposed $Al_2Cu$ precipitates, and the exposed aluminum rich region, in a water environment, can result in the initiation of the deleterious galvanic reaction, creating the unwanted voids in the aluminum based interconnect structure.

Solutions to the galvanic corrosion reaction, during photoresist removal procedures, have been offered by Konno, et al, in U.S. Pat. No. 5,397,432, as well as by Chen, et al, in U.S. Pat. No. 5,545,289. These inventions offer passivation of the exposed sides of the aluminum based interconnect structure, during photoresist post-clean procedures, via the creation of a passivating oxide layer, formed prior to exposure to water post-cleans. cleans. However the creation of these passivating layers can be thin, and porous, with the quality of the native oxide layer, formed during the $H_2O$ vapor passivation step, being marginal. Therefore these passiavting layers may not totally protect against galvanic corrosion during the water post-clean steps. This invention will describe a photoresist removal procedure in which a pre-heat procedure is performed in a high pressure oxygen ambient, prior to the $H_2O$ vapor passivation step, and prior to the subsequent ashing step. This procedure is performed at a temperature, and for a time, needed to create a passivating layer on the sides of the exposed aluminum based interconnect structure. In addition this invention will offer a post-clean DI water rinse, at a temperature between about 5 to 10° C. Since reaction rates approximately doubled with every 10° C. increase, the use of this lower temperature will reduce the galvanic corrosion rate by about 2 to 4 times, if porosity does exist in the passivating sidewall layer.

SUMMARY OF THE INVENTION

It is an object of this invention to form aluminum based interconnect structures, for semiconductor devices, using a process that does not result in void formation in the aluminum based interconnect structures.

It is another object of this invention to form an aluminum based interconnect structure, using a photoresist shape as a mask, to allow an HDPE procedure to pattern an aluminum based layer, and then to subject the aluminum based interconnect structure to a high pressure oxygen ambient, at an elevated temperature, prior to removal of the photoresist layer.

It is still another object of this invention to volatilize chlorides trapped in the ditches of the grain boundries of the alloy, during the high pressure oxygen step, and prior to the $H_2O$ vapor passivation step, reducing corrosion as a result of reducing the level of chlorine, which functions as a catalyst in the corrosion mechanism.

It is still yet another object of this invention to provide a water rinse, to the aluminum based interconnect structure, after photoresist removal, at a temperature between about 5 to 10° C.

In accordance with the present invention a process for patterning of an aluminum based interconnect structure, using photoresist masking and HDPE, and featuring a post-HDPE, oxygen treatment, and a post-photoresist removal, low temperature water rinse, is described. A blanket, aluminum based layer, containing copper and silicon, is deposited on a underlying semiconductor structure. Patterning of the aluminum based layer, creating an aluminum based interconnect structure, is performed using an overlying photoresist shape as a mask to allow a HDPE procedure to transfer the image of the photoresist shape to the underlying aluminum based layer. An insitu photoresist strip is next addressed. First the aluminum based interconnect structure, in a plasma ashing tool, is subjected to a high pressure oxygen ambient, at a temperature greater than 225° C., and for a time of about 25 sec., without the use of a plasma, forming an aluminum oxide layer on the exposed sides of the aluminum based interconnect structure. This is followed by the in situ stripping of the photoresist, in the same plasma ashing tool, with the introduction of $H_2O$ vapor, folllowed by $O_2$ plasma. Finally a de-ionized, (DI), water rinse is used for a post clean, at a temperature of between about 5 to 10° C.

BRIEF DESCRIPTION OF THE DRAWINGS

The object and other advantages of this invention are best described in the preferred embodiment with reference to the drawings that include.

DESCRIPTION OF THE PREFERRED EMBODIMENTS

The method for forming a voidless aluminum based interconnect structure, using an in situ photoresist removal process, used to create an aluminum oxide layer on the exposed sides of the aluminum based interconnect structure, prior to the plasma ashing step, as well as using a cold temperature, DI water post-clean, after photoresist removal, will now be described in detail. This invention is shown using an aluminum based interconnect structure as a first metal level, also used to contact regions of an underlying semiconductor substrate, however this invention can also be used for creation of voidless upper metal levels. In addition this invention is shown being applied to a N channel, metal oxide semiconductor field effect transistor, (MOSFET), device. However this invention can also be applied to P channel MOSFET devices, complimentary, (CMOS), devices, BiCMOS devices, as well as to bipolar devices.

Figure 1:
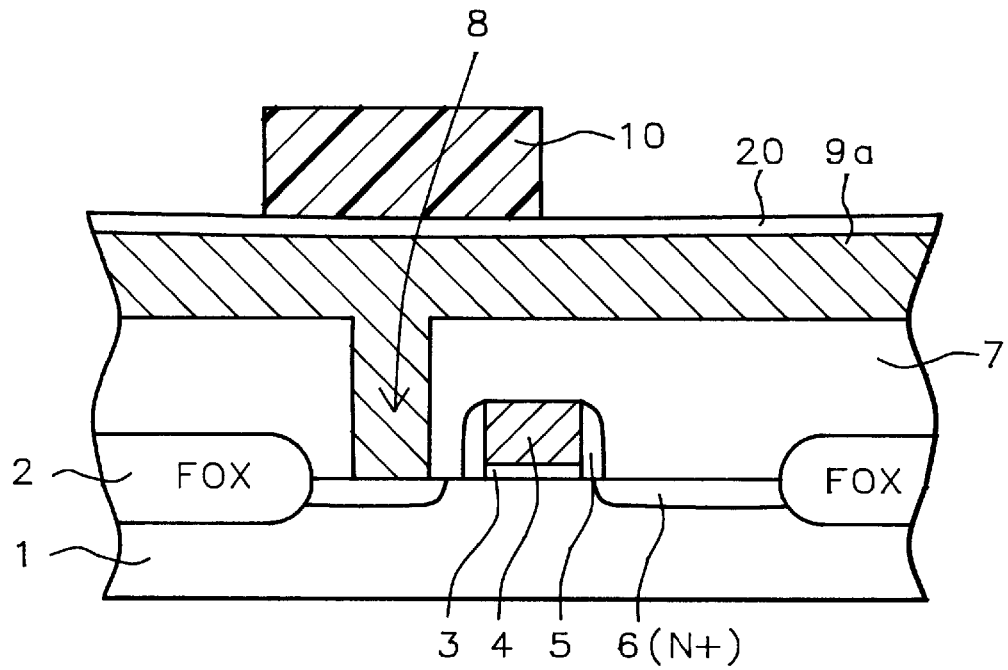
FIGS. 1–2, 4–5, which schematically, in cross-sectional style, show the key stages of forming a voidless, aluminum based interconnect structure.

The N channel, MOSFET device, used in this invention, is schematically shown in FIG. 1. A P type, semiconductor substrate 1, comprised of single crystalline silicon exhibiting a <100> crystallographic orientation, is used. Thick field oxide, (FOX), regions 2, comprised of thermally grown silicon dioxide, at a thickness between about 3000 to 5000 Angstroms, are used for isolation purposes. A gate insulator layer 3, of silicon dioxide, is thermally grown to a thickness between about 50 to 200 Angstroms, followed by the deposition and doping of a polysilicon layer, and patterning of the polysilicon layer, creating polysilicon gate structure 4. Insulator spacers 5, are next created by first depositing as insulator layer such as silicon oxide, or silicon nitride, to a thickness between about 1000 to 3000 Angstroms, and than followed by an anisotropic RIE procedure, using $CHF_3$ as an etchant. Heavily doped, N type, source and drain region 6, is formed via ion implantation of either arsenic or phosphorous. Another insulator layer 7, of silicon oxide, or silicon nitride, is deposited using either low pressure chemical vapor deposition, (LPCVD), or plasma enhanced chemical vapor deposition, (PECVD), and than planarized, using chemical mechanical polishing, (CMP), to provide a smooth top surface topography for insulator layer 7.

A contact hole 8, schematically shown in FIG. 1, is opened in insulator 7, exposing the top surface of source and drain region 6, using conventional photolithographic and RIE procedures. After removal of the photoresist pattern, used to define contact hole 8, via conventional plasma ashing and wet clean procedures, an aluminum based layer 9a, is deposited. Aluminum based layer 9a, schematically shown in FIG. 1, is comprised of aluminum, including between about 1 to 5% copper, used to improve electromigration resistance, and including between about 0.5 to 1.0% silicon, used to decrease the risk of aluminum penetration into the source and drain region 6. When the aluminum based structure is used for upper metal levels, the addition of silicon is not needed. The aluminum based layer is deposited using r.f. sputtering, to a thickness between about 48000 to 52000 Angstroms. A TiN layer 20, used as an anti-reflective layer, for photolithographic procedures, is first deposited on aluminum based layer 9a, followed by the formation of photoresist shape 10, to be used as a mask to allow the desired image to be transferred to aluminum based layer 9a.

Figure 2:
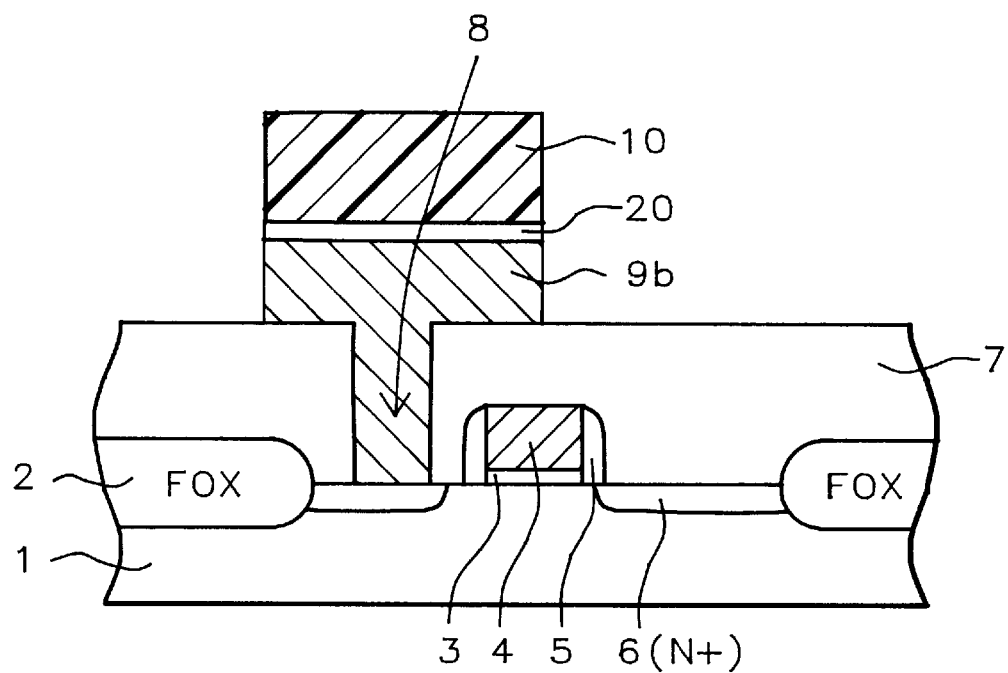
Figure 3:
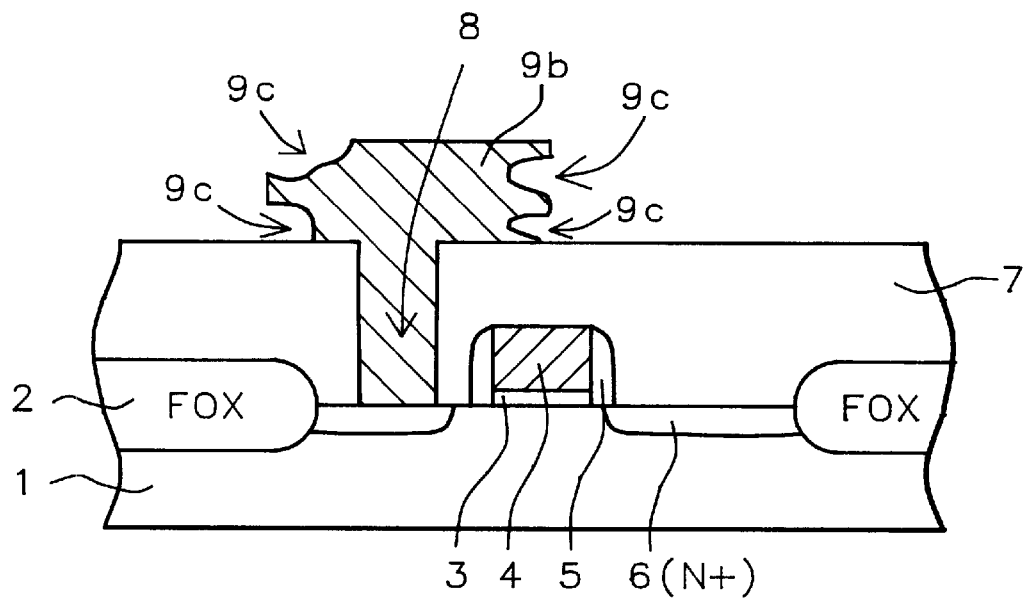
FIG. 3, which schematically, in cross-sectional style, shows the result of a photoresist removal process, other than the process used in this invention, resulting in the creation of voids in the patterned aluminum based structure.

FIG. 2, shows the result of a HDPE procedure, using $Cl_2$ as an etchant, creating aluminum based interconnect structure 9b. The removal of photoresist shape 10, performed using specific $H_2O$ vapor rinsing, oxygen plasma ashing, and DI water post-cleans, can result in the creation of voids in the aluminum based interconnect structure. FIG. 3, shows an aluminum based interconnect structure 9b, after the use of a photoresist removal process, using oxygen plasma ashing, and a room temperature, DI water rinse, resulting in the creation of voids 9c, at the sides of aluminum based interconnect structure 9b. The aluminum based interconnect structure 9b, is comprised of copper rich regions of theta phase $Al_2Cu$ precipitates, surrounded by regions of aluminum, that have almost been depleted of copper. This inhomogeneity in the aluminum based interconnect structure will in effect manifest itself in the form of differential electrochemical cells, where the $Al_2Cu$ precipitates behave as a cathode, while the Al rich regions serve as the anode creating a galvanic couple. The presence of an electrolyte, such as the room temperature water used for photoresist post-clean, can result in localized galvanic corrosion, or void formation, where the Al is oxidized and the copper reduced. The oxidized aluminum, $Al^{3+}$ ions are then leached away by the DI water rinse. The oxygen plasma ashing procedure, used to remove the photoresist shape, and performed prior to the deleterious room temperature rinse, does create an aluminum oxide layer on the exposed sides of the aluminum based interconnect structure, however the thin aluminum oxide layer can be porous, thus still allowing exposure of the sides of the aluminum based interconnect structure, during the room temperature DI rinse. The voids 9c, created in aluminum based interconnect structure 9b, shown in FIG. 3, were a result of galvanic corrosion, resulting from a room temperature DI water rinse, applied post photoresist removal.

Figure 4:
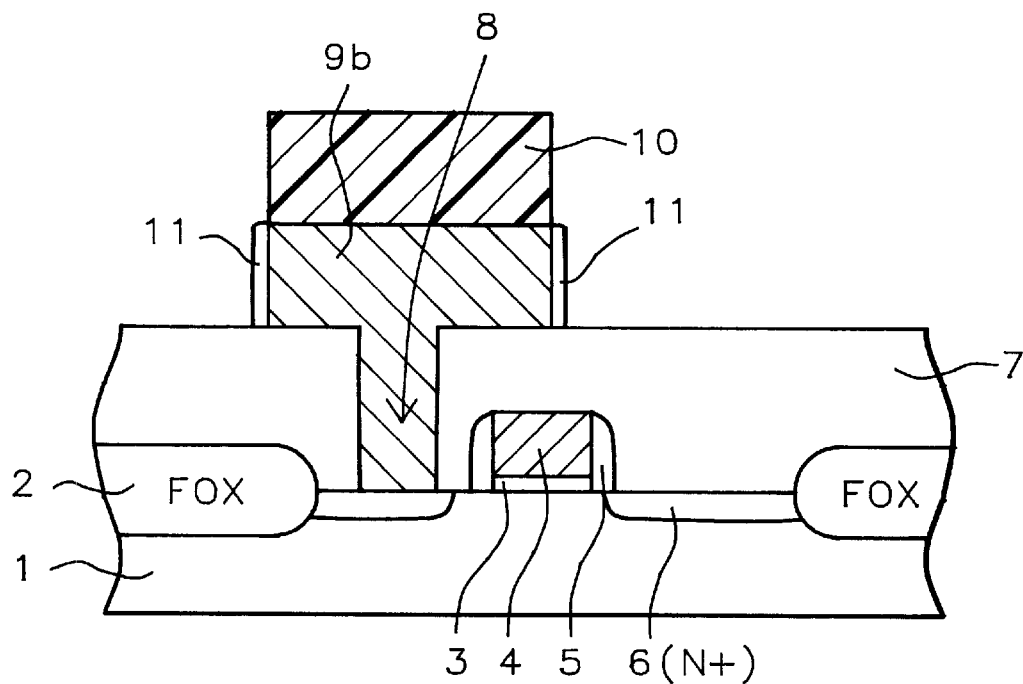
Figure 5:
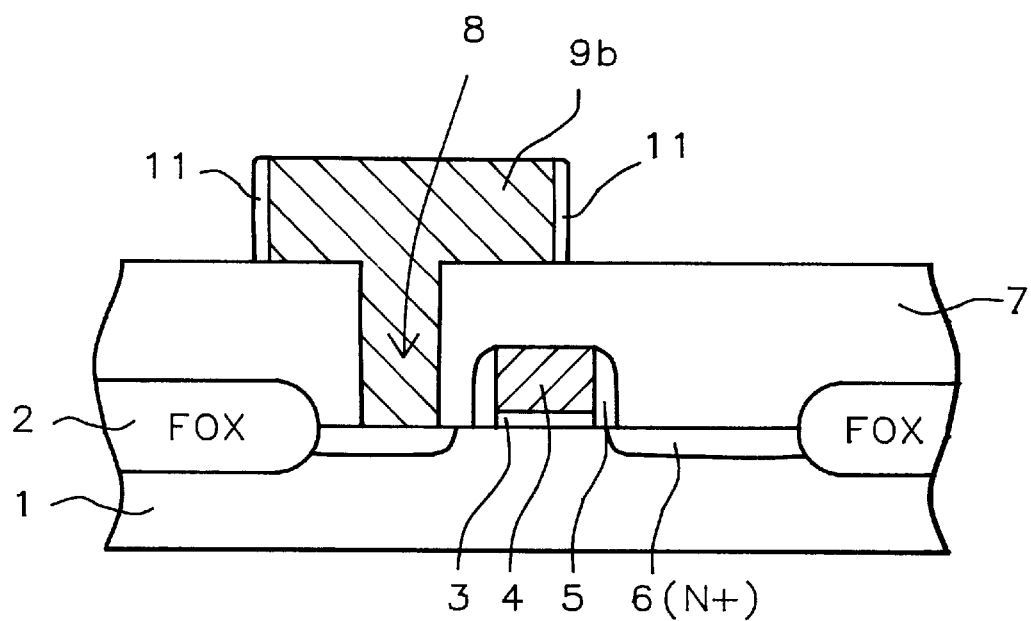

A process used to eliminate void formation during the photoresist stripping, and post clean procedures, is now described and schematically shown in FIGS. 4–5. The TiN layer 20, may also be used for photplithograpic purposes, however it is not shown in in FIGS. 4–5. The in situ photoresist removal procedure, is first performed in an photoresist ashing tool, to create an aluminum oxide layer 11, on the exposed sides of aluminum based interconnect structure 9b. This initial phase is performed prior to introducing the $H_2O$ and $O_2$ plasma. This initial phase is performed in a high pressure oxygen ambient, between about 9 to 10 Torr, at a temperature between about 230 to 250° C., for a time between about 25 to 35 sec., creating aluminum oxide layer 11, at a thickness between about 400 to 800 Angstroms, on the exposed sides of aluminum based interconnect structure 9b. This is shown schematically in FIG. 4. The thickness of aluminum oxide formed during this pre-photoresist removal procedure, offers less risk of porosity than thinner aluminum oxide counterparts, formed only during the actual H$_2$O vapor and oxygen plasma ashing cycle. After the formation of aluminum oxide layer 11, during the initial phase of the in situ photoresist removal procedure, the second phase of the in situ photoresist removal procedure is performed again in the photoresist ashing tool, by creating a plasma and using an H$_2$O vapor rinse, followed by the oxygen plasma ashing procedure. The H$_2$O vapor rinse is performed at a pressure between about 600 to 800 mTorr, an rf power between about 600 to 800 watts, and using between about 400 to 600 sccm of H$_2$O, and between about 300 to 500 sccm of oxygen. The oxygen plasma ashing procedure is performed at a presssure between about 1000 to 1400 mTorr, an rf power between about 800 to 1200 watts, and using between about 1600 to 2000 sccm of oxygen, thus removing photoresist shape 10. An additional layer of aluminum oxide 11, is formed on the top surface of aluminum based interconnect structure 9b, during the oxygen ashing procedure, at the completion of the photoresist removal process. Next a DI water rinse is used for the photoresist removal, post cleaning step, however this procedure is performed at a temperature between about 5 to 10° C. If porosity did exist in aluminum oxide layer 11, exposing the sides of aluminum based interconnect structure 9b, the galvanic corrosion rate, at this temperature, would be reduced by a factor of between about 2 to 4, compared to counterparts subjected to a room temperature DI water rinse. The reduced temperature of the rinse reduces the extent of galvanic corrosion. FIG. 5, shows the result of a aluminum based interconnect structure 9b, in which the removal of a masking photoresist shape was removed using the in situ photoresist removal procedure, and the cold water rinse, resulting in an absence of galvanically formed voids.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating an aluminum based interconnect structure for a MOSFET device, comprising:

providing a transfer gate transistor, on a semiconductor substrate, for said MOSFET device, comprising: field oxide regions in said semiconductor substrate; a gate insulator layer on said semiconductor substrate; a polysilicon gate structure on said gate insulator layer; and source and drain regions in said semiconductor substrate;

depositing an insulator layer on said transfer gate transistor;

opening a contact hole in said insulator layer, exposing the top surface of said source and drain region;

depositing an aluminum based layer on the top surface of said insulator layer, and completely filling said contact hole;

forming a photoresist shape on the top surface of said aluminum based layer;

etching of said aluminum based layer, using said photoresist shape as a mask, creating said aluminum based interconnect structure;

using an initial first phase of an in situ photoresist removal procedure, to form an aluminum oxide layer on the exposed sides of said aluminum based interconnect structure;

using the final phase of said in situ photoresist removal procedure, to remove said photoresist shape; and cold water, post-photoresist removal cleaning of said aluminum based interconnect structure.

2. The method of claim 1, wherein said aluminum based layer is comprised of aluminum, with between about 1.0 to 5.0% copper, and with between about 0.5 to 1.0% silicon, deposited using r.f sputtering, to a thickness between about 48000 to 52000 Angstroms.

3. The method of claim 1, wherein said aluminum based interconnect structure is formed via high density plasma etching, (HDPE), of said aluminum based layer, using Cl$_2$ as an etchant.

4. The method of claim 1, wherein said initial phase of in situ photoresist procedure is performed in a photoresist ashing tool, in an oxygen ambient, without the use of a plasma, at a temperature between about 230 to 250° C., for a time between about 25 to 35 sec., at a pressure between about 9 to 10 Torr, to create between about 400 to 800 Angstroms of aluminum oxide on the sides of said aluminum based interconnect structure.

5. The method of claim 1, wherein said final phase of in situ photoresist removal procedure is performed in said photoresist ashing tool, first using a H$_2$O—O$_2$ vapor, at a pressure between about 600 to 800 mTorr, at an r.f. power between about 600 to 800 watts, and using between about 400 to 600 sccm of H$_2$O, and between about 300 to 500 sccm of oxygen, followed by the oxygen plasma oxygen procedure, performed at a pressure between about 1000 to 1400 mTorr, at an r.f. power between about 800 to 1200 watts, and using between about 1600 to 2000 sccm of in an oxygen ambient.

6. The method of claim 1, wherein said cold water, post photoresist removal cleaning procedure is performed in de-ionized water, at a temperature between about 5 to 10° C.

7. A method of fabricating an aluminum based interconnect structure, using a photoresist shape as a mask, in which the removal of the photoresist shape is performed using a two phase, in situ photoresist removal procedure, followed by a cold temperature, de-ionized water rinse, comprising the steps of:

depositing an aluminum based layer;

forming said photoresist shape on said aluminum based layer;

patterning of said aluminum based layer, using said photoresist shape as a mask, to form said aluminum based interconnect structure;

using the initial phase of said two phase, in situ photoresist removal procedure, to grow between about 400 to 800 Angstroms of an aluminum oxide layer, on the exposed sides of said aluminum based interconnect structure;

using the second phase of said two phase, in situ photoresist removal procedure, to remove said photoresist shape; and using a de-ionized water rinse, at a temperature between about 5 to 10° C., for a post-photoresist removal cleaning procedure.

8. The method of claim 7, wherein said aluminum based layer is comprised of aluminum, with about 1 to 5% copper, and with about 0.5 to 1.0% silicon, deposited using r.f. sputtering, to a thickness between about 48000 to 52000 Angstroms.

9. The method of claim 7, wherein said aluminum based interconnect structure is formed via an HDPE procedure of said aluminum based layer, using Cl$_2$ as an etchant.

10. The method of claim 7, wherein the initial phase of said two phase, in situ photoresist removal procedure, is performed in a photoresist ashing tool, using an oxygen ambient, without a plasma, at a temperature between about 230 to 250° C., for a time between about 25 to 35 sec., at a pressure between about 9 to 10 Torr, creating said aluminum oxide layer.

11. The method of claim 7, wherein said final phase of said two phase, in situ photoresist removal procedure, used to remove said photoresist shape, is performed in a photoresist ashing tool, first using an $H_2O$—$O_2$ vapor, at a pressure between about 600 to 800 mTorr, at an r.f. power between about 600 to 800 watts, and using between about 400 to 600 sccm of $H_2O$, and between about 300 to 500 sccm of oxygen, than followed by an oxygen plasma ashing procedure at a pressure between about 1000 to 1400 mTorr, at an r.f. power between about 800 to 1200 watts, and using a oxygen flow between about 1600 to 2000 sccm.

* * * * *